United States Patent [19]

Leonard

[11] 3,904,892

[45] Sept. 9, 1975

[54] SUPPLY DEPENDENT LOGIC RESET

[75] Inventor: Donald Raymond Leonard, Ridgecrest, Calif.

[73] Assignee: The United States of America as represented by the Secretary of the Navy, Washington, D.C.

[22] Filed: Mar. 26, 1974

[21] Appl. No.: 454,985

[52] U.S. Cl. .......... 307/252 F; 307/235 R; 328/135

[51] Int. Cl.$^{2}$ .......... H03K 17/60

[58] Field of Search ...... 307/235 R, 252 F; 328/135

[56] References Cited

UNITED STATES PATENTS 3,679,912 7/1972 Tenenbaum .................... 307/235 R 3,712,991 1/1973 Albright .......................... 307/252 F

*Primary Examiner*—R. V. Rolinec
*Assistant Examiner*—Lawrence J. Dahl
*Attorney, Agent, or Firm*—R. S. Sciascia; Roy Miller; Robert F. Beers

[57] ABSTRACT

A circuitry for use with a power source which supplies energy to electronic equipment that uses logic circuitry where there is a requirement that the logic circuitry be inhibited when the power source is first activated and remain inhibited until the logic supply voltage level stabilizes at its final output voltage. Once this final voltage output level is reached the inhibited condition of the logic circuitry is removed and logic operation is initiated.

1 Claim, 2 Drawing Figures

SUPPLY DEPENDENT LOGIC RESET

BACKGROUND OF THE INVENTION

Missile and spacecraft technology require the use of semiconductor logic circuitry in many applications. To insure proper operation, for example of a missile it may be necessary to insure that the logic circuitry remain inhibited for a predetermined time after energy is applied to the system. Normally, the inhibit voltage is supplied to the logic reset lines until the logic supply voltage has stabilized at its normal operating level. Once this voltage operating level is reached, the voltage applied to the logic reset line can be removed and logic operation can begin.

A circuitry to accomplish the above is especially advantageous when using high level logic modules such as complementary metal oxide silicon semiconductor devices or the like, that will sustain logic operation over wide variations of the supply voltage source. Numerous present day aircraft launched missiles utilize electronic and fuze systems powered by thermal batteries. This type of power source may have a wide tolerance on the amount of time necessary for the power source to reach its final output level and this characteristic could have a detrimental effect on the operation of the necessary logic requirements imposed on the missile for correct and safe operation.

Prior art attempts at providing a circuitry to accomplish the necessary inhibit action when the logic circuitry is first energized have been typically unsatisfactory because of adverse circuit operation and circuitry complexity which adds to the cost and reduces the overall circuitry reliability. The inherent characteristic of the power source, such as a thermal battery source, requires a variable time delay before reaching the final output voltage. This characteristic makes prior art circuitry unsuitable which are designed with a fixed time delay or circuitry designed to utilize a fixed minimum voltage reference such as a comparator, since these types of circuitry would reset the logic circuitry each time the supply source dropped below the arbitrary fixed minimum voltage level.

The circuit of the invention overcomes the prior art disadvantages by providing a circuit with few components, low cost and high reliability.

SUMMARY OF THE INVENTION

An object of the invention is to provide an electric circuitry configuration that will inhibit logic circuitry until the supply voltage has stabilized and will not respond so as to effect the logic circuitry by subsequent supply voltage variations after logic operations start.

These and other objects, hereinafter defined, are met by the present invention which relates to a circuitry that utilizes a transistor circuit that is held in its nonconducting state to cause voltage to be applied to the logic system reset lines until a predetermined thermal battery voltage level is reached. The logic system circuitry remains inhibited during the rising thermal battery voltage until a programable unijunction transistor or like device conducts allowing current to flow through the transistor bias resistors. The transistor turns on allowing collector current to flow thereby dropping the voltage supplied to the logic reset lines to disable the reset lines and cause logic operations to begin. The programable unijunction transistor gate is permitted to rise only to a predetermined reference voltage level which is controlled by a Zener diode and resistor network. Once the reference voltage level is exceeded, the unijunction transistor turns on permitting current flow through the unijunction transistor to hold the transistor in its conducting state until the current flow is halted by removing the programable unijunction transistor anode current. Subsequent variations in thermal battery voltage will not cause the transistor to turn off at each variation to cause repeated interruption of the logic operation by resetting the system with each voltage variation.

BRIEF DESCRIPTION OF THE DRAWINGS

Referring now to the drawings, in which reference numerals have been used to designate the various components of the circuitry, FIG. 1 shows a preferred embodiment of the voltage supply dependent logic reset circuitry. A source of voltage $E_2$ supplies the collector voltage for transistor 17 via collector resistor 18. Logic reset voltage output terminals 25 are connected between resistor 18 at junction 24 and ground potential. The emitter electrode of transistor 17 connects directly to ground potential. Junction 22 is coupled to the base electrode of transistor 17 and one end of resistor 15, the other end of resistor 15 is connected to ground potential.

Figure 1:
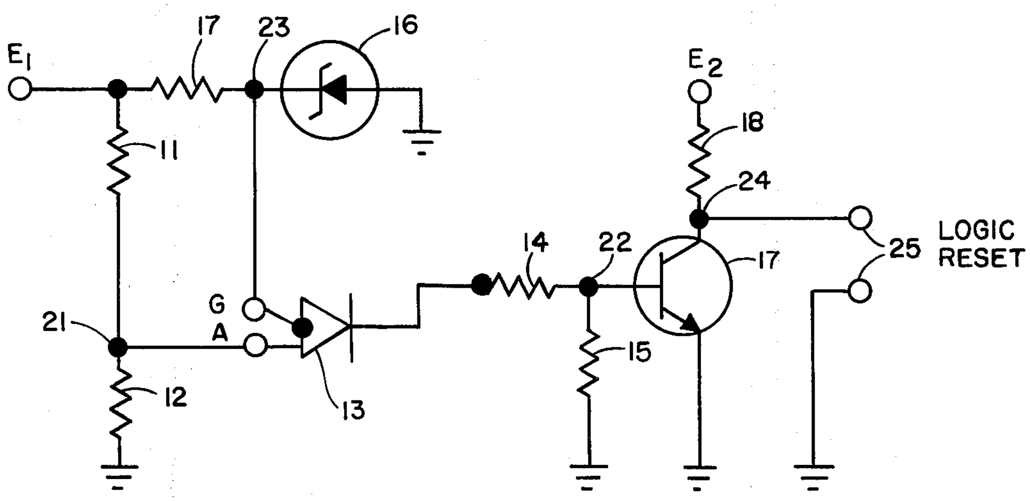
FIG. 1 shows a schematic circuit diagram of a supply voltage detector constructed in accordance with the preferred embodiment of the invention.

A programable unijunction transistor has its cathode electrode connected to ground via series resistors 14 and 15, respectively. A second source of voltage $E_1$, is coupled through resistors 11 and 12, respectively, to ground potential. The anode electrode, designated A, of the unijunction transistor is coupled to junction 21 located between resistors 11 and 12.

The gate electrode of unijunction transistor 13, designated as G, is coupled to junction 23. Resistor 17 has one end connected to voltage $E_1$ and its other end coupled to junction 23. A Zener diode 16 has its cathode connected to junction 23 and its anode electrode coupled to ground potential.

The voltage $E_1$ is supplied by thermal batteries, but this is shown by way of example only, and it is understood that any source of voltage could be employed in the invention with equal facility. The regulated voltage source supplying the logic circuitry is designed to be fixed a predetermined amount below the voltage level of $E_1$ to allow for proper unijunction transistor operation.

In operation the voltages $E_1$ and $E_2$, respectively, are turned on simultaneously. Both voltages start to rise to their maximum voltage levels. The regulated voltage $E_2$ connected to the collector electrode of transistor 17 is applied through terminals 25 to logic reset lines inhibiting logic circuitry operation. Transistor 17 is cut off and the only current conduction is a small collector leakage current. Consequently, there is very little voltage drop across collector resistor 18 and approximately the full value of $E_2$ voltage is present at the collector electrode at junction 24. This voltage appears across the output terminal 25 and inhibits logic circuitry operation.

Figure 2:
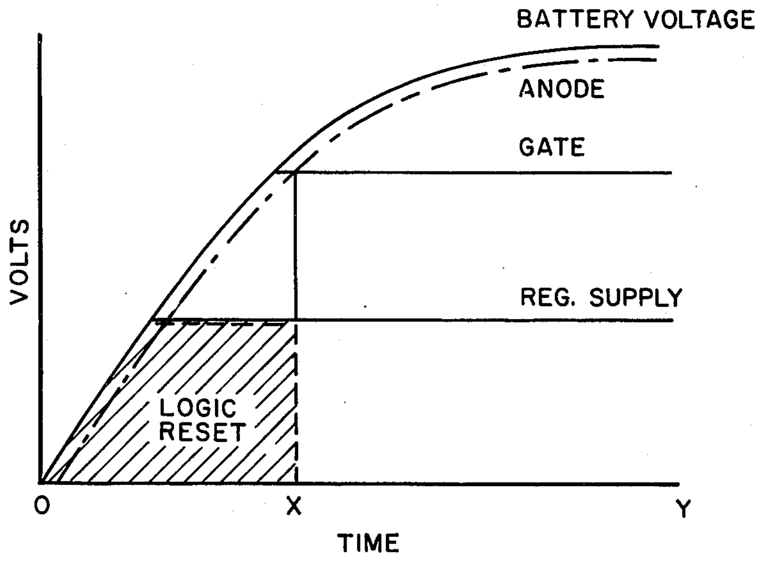
FIG. 2 is a graph illustrating the voltage vs. time sequence of circuit operation.

The thermal battery voltage $E_1$ is also rising toward its maximum value as shown in FIG. 2. Programable unijunction transistor 13 is off and the voltage on gate electrode G rises to a predetermined value of voltage. The voltage is held at this value by Zener diode 16. Zener diode 16 and resistor 17 form a network to clamp the gate electrode at the predetermined voltage gate electrode voltage.

The voltage divider network of resistors 11 and 12, respectively, holds the anode electrode A at a predetermined voltage amount below the gate electrode G causing unijunction transistor 13 to remain off until the anode electrode voltage exceeds the clamped voltage level on gate electrode G. Whenever the anode voltage exceeds the gate voltage the unijunction transistor turns on causing current to flow through resistor 11, anode electrode A, cathode electrode, resistor 14 and resistor 15. The amount of current flow is controlled by resistors 14 and 15 which act as load resistors for unijunction transistor 13. The voltage drop across resistor 15 supplies a proper bias voltage to turn transistor 17 on, allowing collector current to flow, thus dropping the voltage at terminal 24 causing the reset lines to be disabled.

The reset lines remain disabled even though there is subsequent fluctuation in either regulated voltage $E_2$ or thermal battery voltage $E_1$. This is caused by the ineffectiveness of the control voltage on gate electrode G once anode current flow through unijunction transistor 13 has been initiated. Even though the control voltage becomes removed the rectifier 13 remains on and maximum current continues to flow until $E_1$ voltage is interrupted or reversed.

Although the preferred embodiment has been described, it will be understood that within the purview of this invention various changes may be made in the form, details, proportion and arrangement of parts, the combination thereof and mode of operation, which generally stated consist in a device capable of carrying out the objects set forth, as disclosed and defined in the appended claims.

What is claimed is:

1. An electronic circuitry apparatus to detect a magnitude of voltage output supplied by a unidirectional power source when under initial load conditions and for supplying a signal output when the voltage reaches a predetermined level comprising;

reference voltage means including conduction means connected thereto for providing a fixed predetermined minimum voltage level from said unidirectional power source;

resistive voltage divider network coupled between said unidirectional power source and ground potential for providing a voltage level that remains a predetermined amount below said power source voltage level;

a programmable unijunction transistor device having an anode electrode electrically coupled to said resistive voltage divider, a cathode electrode and a gate electrode, said gate electrode electrically coupled to said reference voltage means;

resistive bias means electrically coupled to said cathode electrode for supplying a bias voltage level that is dependent upon the current flow through said conduction means; and a transistor having a base electrode coupled to said resistive bias means, emitter electrode coupled to said ground potential and collector electrode coupled to a source of regulated voltage;

whereby said programmable unijunction transistor device goes into a conducting state when the voltage supplied by said resistive voltage divider network exceeds the fixed predetermined voltage of the reference voltage means and the current supplied by the unijunction transistor device turns on the transistor and holds it on until the current is interrupted.

* * * * *